United States Patent [19]
Griley et al.

[11] Patent Number: 6,061,889
[45] Date of Patent: May 16, 2000

[54] DEVICE AND METHOD FOR REMOVING HEATSPREADER FROM AN INTEGRATED CIRCUIT PACKAGE

[75] Inventors: Kristine Griley, San Jose; Steven Scott, Los Gatos; Dan Sullivan, Sunnyvale, all of Calif.

[73] Assignee: LSI Logic Corporation, Milpitas, Calif.

[21] Appl. No.: 09/100,665

[22] Filed: Jun. 19, 1998

[51] Int. Cl.$^7$ ...................................................... B23P 19/00
[52] U.S. Cl. ............................... 29/426.5; 29/267; 29/764
[58] Field of Search ............................... 29/426.4, 426.5, 29/764, 267, 270, 890.031; 156/344, 584

[56] References Cited

U.S. PATENT DOCUMENTS

| | | | |
|---|---|---|---|
| 4,507,861 | 4/1985 | Sprenkle | 29/741 |
| 4,528,746 | 7/1985 | Yoshimura | 29/743 |
| 4,805,298 | 2/1989 | Takahashi | 29/764 |
| 4,980,635 | 12/1990 | Walton et al. | 324/158 F |
| 5,046,237 | 9/1991 | Conforti et al. | 29/764 |
| 5,052,101 | 10/1991 | Bright et al. | 29/749 |
| 5,062,201 | 11/1991 | Long, Jr. | 29/741 |
| 5,332,463 | 7/1994 | Eberlein et al. | 29/759 |
| 5,568,683 | 10/1996 | Chia et al. | 29/832 |

*Primary Examiner*—David P. Bryant
*Assistant Examiner*—Jermie E. Cozart
*Attorney, Agent, or Firm*—Joseph Lally; Dewan & Lally, L.L.P.

[57] ABSTRACT

A device for removing a heatspreader from an integrated circuit package (ICP) according to the present invention. The device includes a base piece that is preferably made of a suitably rigid and thermally conductive base material such as tool steel. The base piece defines a base cavity that is adapted to receive and engage the heatspreader. The depth of the base cavity is approximately equal to a thickness of the heatspreader. The device further includes a top piece comprised of a suitable top material such as tool steel. The top piece includes a body portion from which an elongated member or handle extends. The body portion of the top piece defines a top cavity adapted to receive and engage the integrated circuit package. The elongated member is suitable for manipulating the body portion of the top piece to apply a torquing force to the ICP package when it is engaged in the top cavity. The base cavity of the base piece and the top cavity of the top piece are adapted to form an enclosure suitable for retaining the ICP and the heatspreader when the base piece is suitably aligned and in contact with the top piece. In this configuration, with the heatspreader being engaged by the base cavity and the package being engaged by the top cavity, the top piece is suitable for applying a torquing force to the ICP while the base piece retains the heatspreader to thereby eventually separate or remove the heatspreader from the ICP of the integrated circuit package.

20 Claims, 4 Drawing Sheets

DEVICE AND METHOD FOR REMOVING HEATSPREADER FROM AN INTEGRATED CIRCUIT PACKAGE

BACKGROUND OF THE INVENTION

1. Field of the Invention

The invention relates to the field of integrated circuit packaging and failure analysis and more particularly to a method and device for removing a heatspreader from an integrated circuit package such as a flip chip.

2. Description of the Relevant Art

Integrated circuits are universally familiar devices found in an enormous variety of consumer, business, and industrial machines and products. An integrated circuit is an electronic device typically fabricated on a single crystal substrate preferably comprised of silicon or other suitable semiconductor material. Semiconductors such as silicon possess characteristics useful in the manufacturing of integrated circuits including a resistivity that can be easily manipulated over an extremely wide range of values and a compatibility with oxidation processes that facilitate formation of high quality electrically insulating films. During the fabrication process, thousands or millions of circuit elements such as transistors, diodes, resistors, and capacitors are simultaneously formed on the substrate through a series of well known fabrication steps during which the conductances of precisely defined regions within the substrate are altered to achieve a particular circuit element and to isolate the individual circuit elements from one another. The individual circuit elements are then selectively interconnected to each other using one or more photolithographically defined interconnect layers to produce a circuit having the desired functionality. Typically, multiple integrated circuits are fabricated simultaneously on a single, round slice or wafer of the semiconductor material with a typical diameter of 150, 200, or 300 mm (although other wafer diameters are sometimes encountered). After the completion of the fabrication process, the wafer is tested to determine which of the integrated circuits are functional. The wafer is then "diced" or sawed into the individual integrated circuits and the functional integrated circuits are placed in a protective casing or package.

Although modern integrated circuits incorporate literally millions of transistors, the signals flowing to and from the integrated circuit (the I/O signals) are necessarily limited in number because each I/O signal requires a conductive and relatively large I/O pad to which an external connection, such as a connection to a printed circuit board on which the integrated circuit is mounted, can be made. Thus, the packaging of an integrated circuit involves not only a means for protecting the integrated circuit from physical damage, but also a method of making external connections to the I/O pads of the device. For much of the history of the semiconductor industry, the predominant method of connecting the I/O pads of the packaged integrated circuit to the external environment utilized wire bond technology. In a typical wire bond arrangement, a first end of a thin and electrically conductive wire is attached to an I/O pad while the second end is attached to a lead frame or other packaging structure that provides a conductive path to the integrated circuit leads as well as physical support for the integrated circuit. The device and lead frame are then encased in the packaging material (e.g. plastic or ceramic) such that the leads are externally accessible and suitable for mounting on a circuit board or other structure.

As fabrication process technology has evolved to the point that minimum transistor geometries are now routinely less than 0.5 µm, devices of ever greater complexity (i.e. more transistors) are being produced on a decreasing area of silicon (or other suitable substrate material). Market demands for smaller, faster, and more complex devices that integrate multiple sub-systems on a single chip have resulted in devices with an ever increasing lead or pin count. The simultaneous demands for higher pin counts and smaller packages has placed greater emphasis on packaging technology. Flip chip technology has evolved as a popular packaging technique to achieve large pin counts in small packages. Flip chips do away with wire bonding by packaging the device with its active surface "flipped" with respect to the orientation of predecessor packaging technologies and connecting the I/O pads of the device directly to the printed circuit board.

Referring to FIG. 1, a typical flip chip 120 is shown. Flip chip 120 includes am integrated circuit 102 contained in an integrated circuit package (ICP) 122. Typically, ICP 122 provides a cavity into which integrated circuit 102 is placed. Integrated circuit 102 is fabricated on a substrate 105, preferably comprised of single crystal silicon, that includes an active surface 104 and a backside 106. Active surface 104 refers to the surface proximal to which the active elements of the integrated circuit are fabricated. A thermal paste (represented in FIG. 1 by reference numeral 126) is typically applied to integrated circuit 102 to improve the heat dissipation characteristics of flip chip 120. Suitable thermal pastes are commercially available from a variety of sources and are well known in the field of semiconductor packaging. In many flip chip processes, the ICP cavity is sealed with a heatspreader 124 attached to the top of ICP 122. As their name implies, heatspreaders are designed to further dissipate heat generated by integrated circuit 102 to prevent the device from overheating and suffering permanent damage. The high operating speeds of modern integrated circuits and the tremendous number of transistors now available on a single chip have resulted in devices that produce an unprecedented amount of thermal energy during operation. Without the assistance of thermally efficient packages and accompanying heat sinks, these high speed devices would tend to overheat and self destruct. Heatspreaders facilitate heat dissipation by providing a material of high thermal conductivity in close proximity to the device.

Despite the best efforts of semiconductor manufacturers to eliminate randomly generated particles and other defects that can render devices non-functional, some fraction of the integrated circuits produced by a manufacturer will fail to operate properly. In addition, a number of devices that are initially functional will fail at some point after the device has been packaged and possibly after the device has been installed in an application. An important function within any semiconductor fabrication facility involves investigating and identifying the sources of yield limiting phenomena, early lifetime failures, and other problems and reducing or eliminating those sources. The process of achieving these goals is commonly referred to as failure analysis. One of the unintended consequences of the relatively recent explosion in the wide spread use of miniaturized packages is the increased burden placed on failure analysis personnel to properly study devices that fail after they have been packaged. One can imagine that, at some point in the failure analysis process, it is necessary to visually inspect (with or without the aid of a microscope and various other analysis tools) the integrated circuit itself. Once a device has been packaged, however, visual inspection of that device presents significant problems, not the least of which is the process of trying to remove or open the package to allow access to the device without physically damaging the device itself. These considerations take on additional significance when one considers the relatively low level of failures associated with integrated circuits. Because the number of samples of devices failing in the field or after packaging is typically well below 0.1%, it becomes extremely important to gather as much information as possible from each sample of an actual failure. Accordingly, it is important to be able to gain physical and visual access to integrated circuits that fail after they have been packaged to perform proper failure analysis.

SUMMARY OF THE INVENTION

The problems identified above are in large part addressed by a device for removing a heatspreader from an integrated circuit package according to the present invention. The device includes a base piece that is preferably made of a suitably rigid and thermally conductive base material such as tool steel. The base piece defines a base cavity that is adapted to receive and engage the heatspreader. The depth of the base cavity is approximately equal to a thickness of the heatspreader such that the package to which the heatspreader is affixed is exterior to the base cavity when the heatspreader is engaged in the base cavity. The device further includes a top piece comprised of a suitable top material such as tool steel. The top piece includes a body portion from which an elongated member or handle extends. The body portion of the top piece defines a top cavity adapted to receive and engage the integrated circuit package. The elongated member is suitable for manipulating the body portion of the top piece to apply a torquing force to the package when the package is engaged in the top cavity. In addition, the base cavity of the base piece and the top cavity of the top piece are adapted to form an enclosure suitable for retaining the package and the heatspreader when the base piece is suitably aligned and in contact with the top piece. In this configuration, with the heatspreader being engaged by the base cavity and the package being engaged by the top cavity, the top piece is suitable for applying a torquing force to the package utilizing the elongated member while the base piece retains the heatspreader to thereby eventually separate or remove the heatspreader from the package.

In the presently preferred embodiment, the device is designed for use with a flip chip in which an integrated circuit is enclosed within a integrated circuit package. Solder bumps are attached to the I/O pads of the integrated circuit and these solder bumps extend to the exterior of the package to make a direct connection to a suitable mounting location such as a printed circuit board. The heatspreader is attached to the top of the package and is preferably comprised of a suitable thermal conductor. In one embodiment, the heatspreader is comprised of a copper sheet or plate that is encased in nickel to provide mechanical reinforcement. The nickel is preferably coated with a thin film of gold to prevent unwanted oxidation. The thickness of the heatspreader is preferably in the range of approximately 0.3 to 1.5 mm.

To prevent unwanted or premature deterioration of the base and top cavities due to prolonged usage, the rigidity of hardness of the base and top piece are preferably greater than the hardness of the heatspreader. In addition, it is preferable if the base piece is able to efficiently conduct heat for embodiments of the present invention in which is desired to heat the heatspreader and package prior to attempting to separate them. In the presently preferred embodiment, tool steel is used as the primary material for the top and base piece to meet both of these criteria. Ideally, the base piece is essentially rectangular and has a substantially planar surface into which the base cavity is formed. The base cavity is preferably dimensioned with approximately the same dimensions as the heatspreader. Similarly, the body portion of the top piece is essentially rectangular and has a substantially planar surface into which the top cavity is formed. The top cavity is dimensioned with approximately the same dimensions as the package. A suitable depth of the top cavity is preferably in the range of approximately 2.0 to 8.0 mm.

In one embodiment the top piece itself includes two pieces, a first top piece and a second top piece. The first top piece is affixed to the second top piece with a suitable fastening means such as a steel screw. The first top piece includes the elongated member while the second top piece includes the body portion of the top piece (including the top cavity). In this embodiment, the second top piece is replaceable in the event that the base cavity has a different dimension in order to accommodate various heatspreader sizes. The second top piece can suitably be replaced to match the base cavity dimension.

The present invention still further contemplates a method of removing a heatspreader from an integrated circuit package to which the heatspreader is attached. The heatspreader is inserted into a base cavity formed in the base piece of a remover device. The cavity is adapted to receive and engage the heatspreader. The depth of the base cavity is approximately equal to the thickness of the heatspreader such that the package is substantially exterior to the base cavity when the heatspreader is positioned in the base cavity. The integrated circuit package is then engaged with a top cavity formed in a body portion of a top piece of the remover device. The top piece includes an elongated member extending from the body portion and suitable for manipulating the body portion. Thereafter, with the heatspreader engaged in the base cavity and the package engaged in the top cavity, the extended member of the top piece is utilized to apply a torquing force to the package by moving the top piece relative to the base piece, wherein the torquing force is sufficient to remove the heatspreader from the package.

In one embodiment, the method further includes, prior to the step of removing the top piece, heating the heatspreader to a temperature in excess of approximately 125° C. and still more preferably in the range of approximately 125 to 160° C. In one embodiment, the heating of the heatspreader is achieved by heating the base piece to a temperature in the range of approximately 125 to 160° C. and, thereafter, inserting the heatspreader into the base cavity and maintaining the heatspreader within the base cavity for a duration sufficient to raise the temperature of the heatspreader to in the range of approximately 125 to 160° C. In one embodiment, the method includes the step of affixing the base piece to a stable platform prior to inserting the heatspreader into the base piece to facilitate the application of the torquing force to the package.

BRIEF DESCRIPTION OF THE DRAWINGS

Other objects and advantages of the invention will become apparent upon reading the following detailed description and upon reference to the accompanying drawings in which.

Figure 1:
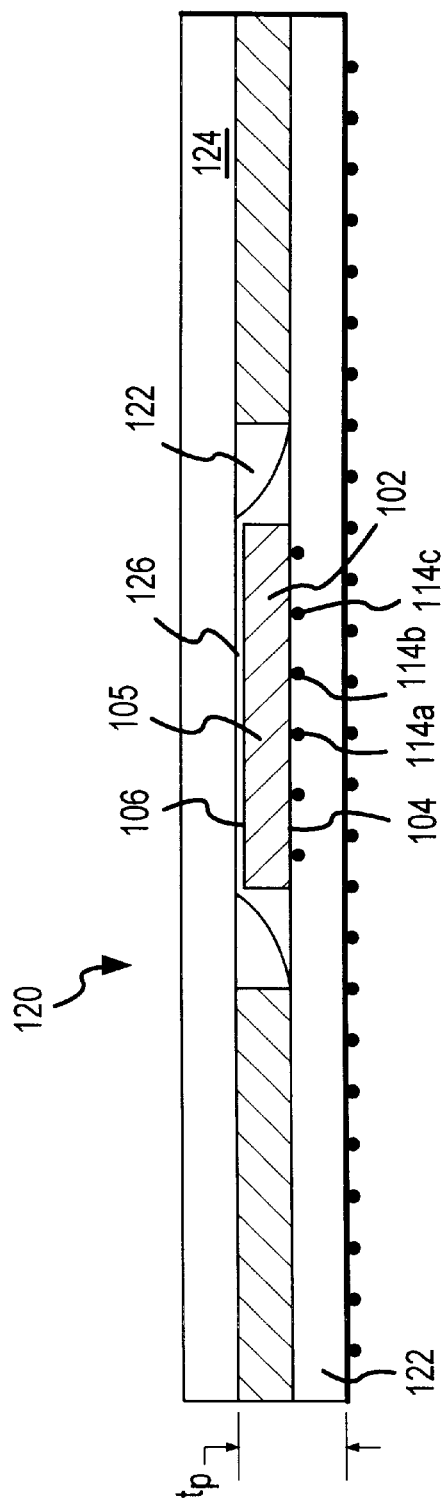
FIG. 1 is a view of a flip chip integrated circuit packaging arrangement in which a heatspreader is affixed to an upper surface of a package and an integrated circuit is located within the package cavity.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 3:
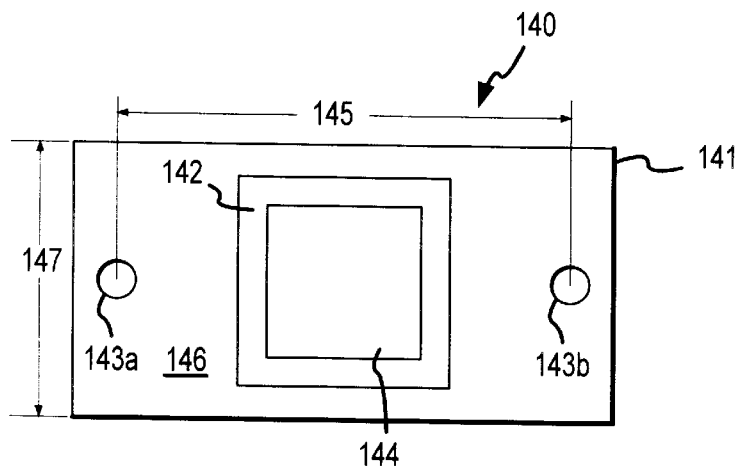
FIG. 3 is a top view of a base piece of a heatspreader remover device according to the present invention.
Figure 4:
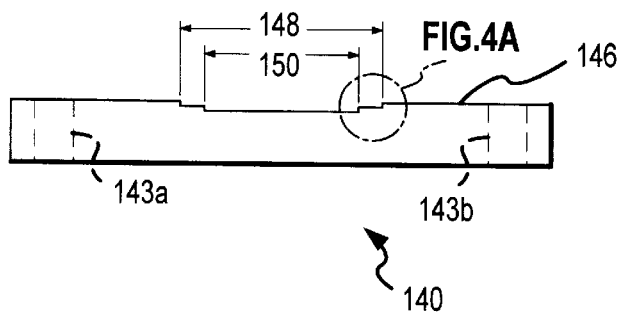
FIGS. 4 & 5 are cross sectional views of the base piece of FIG. 3.
Figure 5:
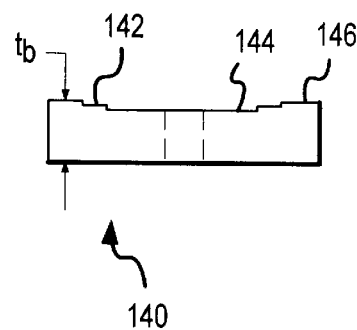
Figure 4A:
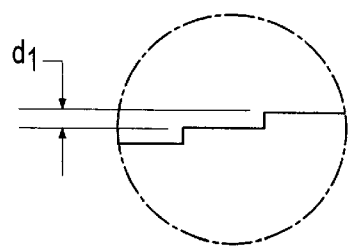

Turning now to the drawings, FIGS. 3–5 depict various views of a base piece 140 of a heatspreader remover device 190 (shown in FIG. 9) for removing a heatspreader 124 (shown in FIG. 1) from an integrated circuit package (ICP) 122 without substantially damaging or destroying the packaged integrated circuit device 102 for facilitating failure analysis of device 102. Base piece 140 is comprised of a base material. In the preferred embodiment, the base material has a rigidity or hardness value that is greater than the rigidity of heatspreader 124 to prevent or reduce substantial deformation or wear and tear on the base device through repeated usage. In addition, it is preferably if the base material is a good thermal conductor for applications of the present invention in which it is desirable to heat base piece 140 as part of the heatspreader removal process. (As used herein, a good thermal conductor refers to a material having a thermal conductivity in excess of approximately 25 J/s-m-C°). For applications in which heatspreader 124 is comprised of copper, nickel, gold or a combination thereof, tool steel provides a suitable base material that satisfies both of the aforementioned requirements.

Figure 2:
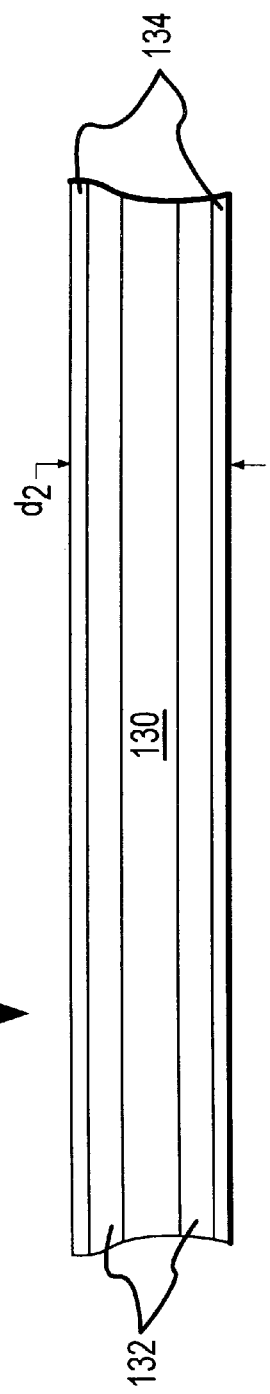
FIG. 2 is a partial cross sectional view of one embodiment of the heatspreader of FIG. 1.

Typically, base piece 140 includes a rectangular perimeter 141 and a substantially planar surface 146 into which a base cavity 142 is formed. Base cavity 142 is dimensioned such that it is adapted to receive and engage heatspreader 124. Referring briefly to FIG. 2, the preferred embodiment of heatspreader 124 is depicted. In this embodiment, heatspreader includes a copper center 130 desirable for its high thermal conductivity and preferably encased in a supporting metal 132 such as nickel to provide mechanical support to copper center 130. Gold plating 134 is typically applied to the nickel encasing 132 to reduce or prevent oxidation of the underlying metals. Returning now to FIGS. 3–5, the depth $d_1$ (as shown in FIG. 4) of base cavity 142 is ideally approximately equal to a thickness $d_2$ (as shown in FIG. 2) of heatspreader 124. In the presently preferred embodiment, depth $d_1$ of base cavity 142 is in the range of approximately 0.3 to 1.5 mm. The embodiment of base piece 140 shown in FIGS. 3–5 includes a second base cavity 144 that has a smaller perimeter and a greater depth than base cavity 142. This embodiment includes the additional base cavity to facilitate insertion and removal of heatspreader 124 from base cavity 142. It will be appreciated that different arrangements of additional cavities such as second cavity 144 within base piece 140 may be provided in various embodiments of the invention. The essential requirement, however, of base piece 140 is that it include at least one base cavity 142 adapted to receive heatspreader 124. The additional cavities provided in alternative embodiments are considered to be optional for purposes of the invention described herein and the inclusion of a second cavity 144 in the drawings should not be taken to depict second base cavity 144 as a mandatory element or feature of the invention.

In the preferred embodiment, base cavity 142 is typically square and has side length represented in the drawing by reference numeral 148 typically in the range of approximately 20 to 60 mm, which is suitable for most common packing configurations. Preferably, base piece 140 further includes means for attaching base piece 140 to a stable platform (not shown in the drawings) such as a heater block, bench, or table. In FIGS. 3 and 4, holes 143a and 143b provide a suitable means for attaching base piece 140 to such a platform. In one embodiment, holes 143a and 143b are machined or threaded to receive steel screws or other suitable fastening means. The centers of holes 143a and 143b are displaced by a suitable displacement 145 typically in the range of approximately 50 to 130 mm. The thickness $t_b$ of base piece 140 should be sufficient to provide mechanical strength, yet thin enough such that the time required to heat base piece 140 (in those embodiments in which is desired to heat heatspreader 124 prior to removal) is not excessive. For applications in which tool steel is chosen as the material for base piece 140, a suitable thickness $t_b$ is in the range of approximately 10 to 15 mm.

Figure 8:
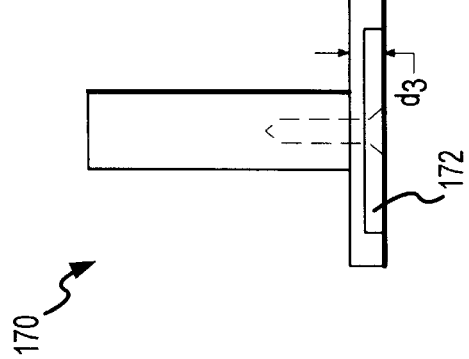
FIGS. 7 & 8 are cross sectional views of the top piece of FIG. 6.
Figure 6:
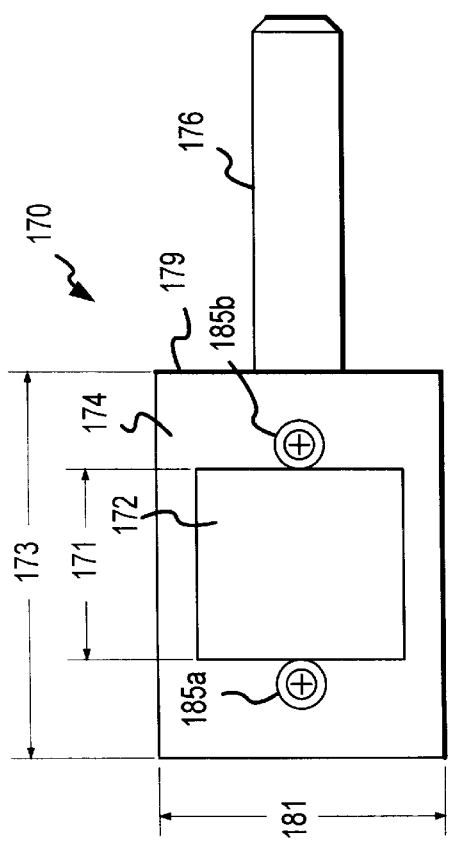
FIG. 6 is a top view of a top piece of a heatspreader remover device according to the present invention.
Figure 7:
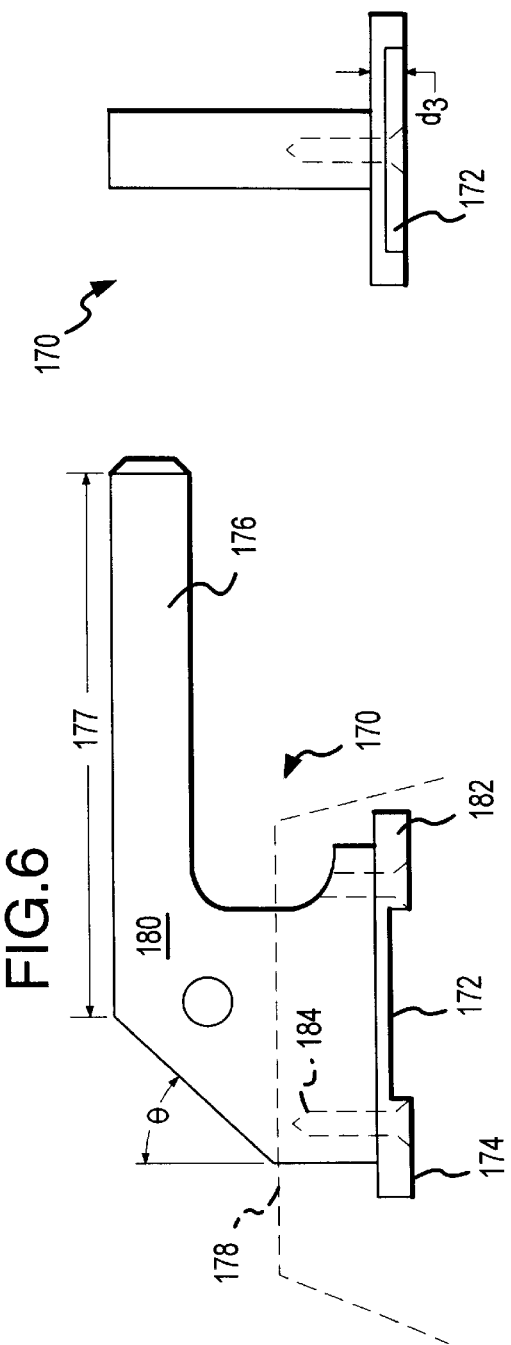

Turning now to FIGS. 6–8, a top piece 170 of heatspreader remover 190 is shown. Top piece 170 is comprised of a suitable top material that provides sufficient strength to withstand repeated usage without deformation. In addition to providing a material useful for base piece 140, tool steel provides a suitable material for top piece 170. Top piece 170 includes a body portion 178 that defines a top cavity 172. Top cavity 172 is dimensioned such that it is suitable for receiving and engaging ICP 122 (as shown in FIG. 1). Top piece 170 further includes an elongated member 176 that is connected to and extends away from body portion 178. Elongated member 176, which functions as a handle, is suitable for manipulating body portion 178 of top piece 170 to apply a torquing force to an object such as an integrated circuit package when the package is received within top cavity 172. In the preferred embodiment, top cavity 172 is formed into a substantially planar surface 174. A depth $d_3$ of top cavity 172 is preferably suited to receive an integrated circuit package such as a flip chip. Consequently, in one embodiment, depth $d_3$ of top cavity 172 is approximately equal to a thickness $t_p$ (shown in FIG. 1) of ICP 122, which is typically in the range of approximately 2.0 to 4.0 mm. Top cavity 172, in the embodiment depicted, is square and has a dimension represented by reference numeral 171 in the range of approximately 20 to 60 mm. In embodiments of the present invention designed in conjunction with packages wherein heatspreader 124 has essentially the same dimensions as ICP 122, dimension 171 of top cavity 172 is substantially equal to dimension 148 of base cavity 142. The substantially planar surface 174 into which top cavity 172 is formed preferably has a rectangular perimeter 179 of which the longer dimension 173 is suitably in the range of approximately 50 to 100 mm and the shorter dimension 181 is in the range of approximately 25 to 75 mm. The range of dimension 177 of elongated member 176 is preferably in the range of approximately 80 to 130 mm while the angle Θ is preferably in the range of approximately 40 to 50°. In one embodiment suitable for providing a replaceable top cavity 172, top piece 170 is itself comprised of a first piece 180 and a second piece 182. The replaceable top cavity embodiment accommodates a variety of differently dimensioned base cavities 142 and facilitates the replacement of an old top cavity as the old cavity becomes worn. In this embodiment, first piece 180 includes elongated member 176 while second piece 182 defines top cavity 172. The two top pieces in this embodiment are attached to each other using suitable fastening means such as steel screws 184 threaded through holes 185a and 185b displaced on opposite sides of first cavity 172.

Figure 9:
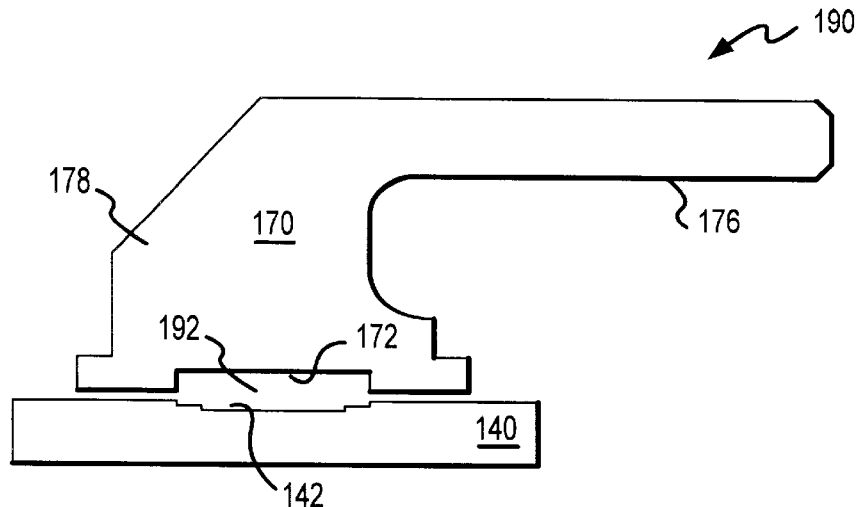
FIG. 9 is a side of view of a heatspreader remover device in accordance with the present invention depicting the top piece and the bottom piece in proximity to one another.

Turning now to FIG. 9, heatspreader remover 190 is presented as a composite of base piece 140 and top piece 170. Base cavity 142 of base piece 140 and top cavity 172 of top piece 170 are suitably dimensioned and adapted to form an enclosure 192 when base piece 140 is aligned and in contact with top piece 170. Enclosure 192 is suitable for retaining an integrated circuit package such as flip chip 120 with heatspreader 124 engaged in base cavity 140 and ICP 122 engaged in top cavity 172. With ICP 122 situated within enclosure 192, an appropriate torquing force is applied to elongated member 176 of top piece 170 to transmit the force to ICP 122 within top cavity 172. Upon application of a sufficient torquing force for a sufficient duration, the present invention facilitates removal of heatspreader 124 from ICP 122.

Figure 10:
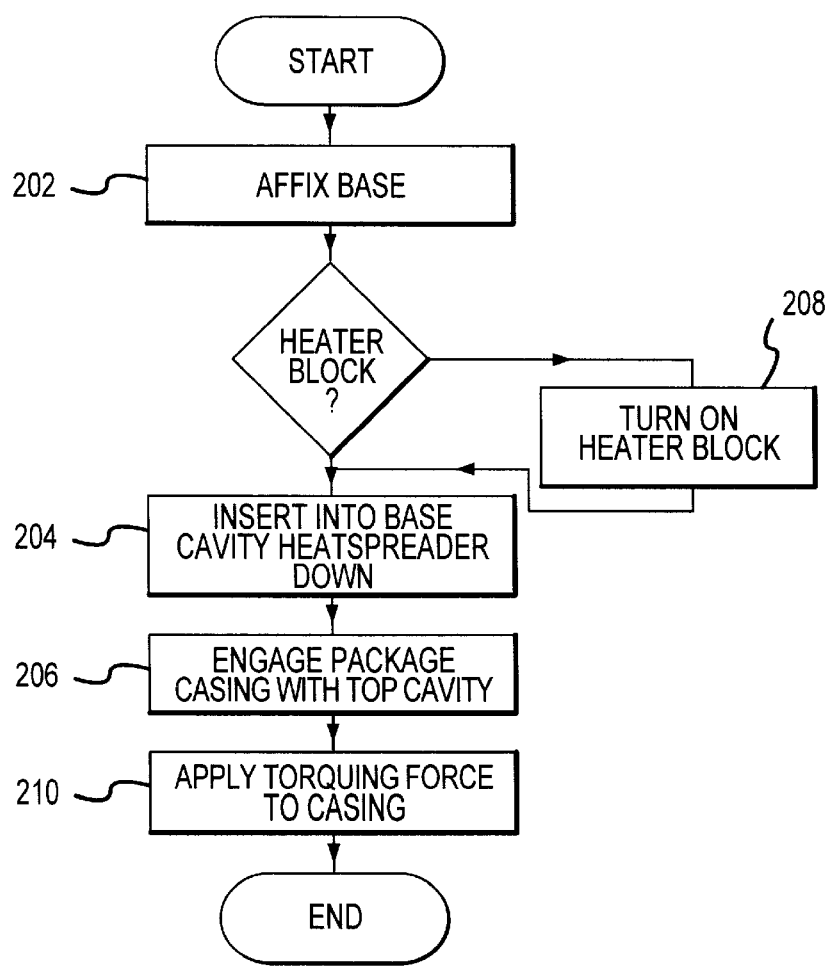
FIG. 10 is a flow diagram of a method of removing a heatspreader from an integrated circuit package according to the present invention.

In addition to heatspreader remover 190 as described herein, the present invention further contemplates a method of removing heatspreader 124 from ICP 122 using device 190. Turning to the simple flow diagram of FIG. 10, an optional method step represented by reference numeral 202 indicates attaching or affixing base piece 140 to a stable platform such as a work bench, heater block, or table top to prevent unwanted movement of base piece 140 during the removal process. The means of attaching base piece 140 to the stable platform may include simply clamping base piece 140 to the platform or a more permanent method such as screwing base piece 140 to the platform. In an embodiment in which it is desirable to heat ICP 122 and heatspreader 124 to facilitate the removal process by reducing the strength of the bond with which bonding paste or other adhesive secures heatspreader 124 to ICP 122, an optional method step (designated by reference numeral 208) includes heating heatspreader 124 to a suitable temperature prior to applying a torquing force to ICP 122 through elongated member 176. In an embodiment in which base piece 140 comprises tool steel or other suitable thermal conductor, the heating of heatspreader 124 may be accomplished by simply applying a heater block or other heating device to base piece 140 and inserting and retaining heatspreader 124 in base cavity 142 for a duration sufficient to raise the temperature of heatspreader 124 to the desired temperature. In a presently preferred embodiment, a suitable temperature is typically in excess of approximately 125° C. and still more suitably in the range of approximately 125 to 160° C. The heatspreader 124 is then inserted into base cavity 142 as depicted in step 204 of the figure and ICP 122 is engaged in top cavity 172 as indicated in process step 206. Elongated member 176 of top piece 170 is then utilized to apply a torquing force to ICP 122 for a duration and force sufficient to remove heatspreader 124 from ICP 122 in the method step represented by reference numeral 210.

It will be apparent to those skilled in the art of failure analysis or deprocessing having the benefit of this disclosure that the present invention contemplates a device and method useful in facilitating failure analysis of a semiconductor integrated circuit by simplifying the process of removing the heatspreader from an integrated circuit package. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A device for removing a heatspreader from an integrated circuit package (ICP), said device comprising:
   a base piece comprised of a base material, wherein said base piece includes a surface into which a base cavity is formed, wherein the base cavity is adapted to receive and engage said heatspreader, and wherein a depth of said base cavity is approximately equal to a thickness of said heatspreader whereby said package to which said heatspreader is affixed is exterior to said base cavity when said heatspreader is engaged in said base cavity;
   a top piece comprised of a top material, wherein a body portion of said top piece includes a surface into which a top cavity is formed, wherein the top cavity is adapted to receive and engage said package, said top piece further including an elongated member extending away from said body portion, wherein said elongated member is suitable for manipulating said body portion to apply a torquing force to said package when said package is engaged in said top cavity; and
   wherein, said base cavity of said base piece and said top cavity of said top piece are adapted to form a enclosure suitable for retaining said ICP and said heatspreader when said surface of said base piece is aligned and in contact with said surface of said top piece, with said heatspreader being engaged by said base cavity and said ICP being engaged by said top cavity such that said top piece is suitable for applying a torquing force to said heatspreader while said base piece retains said ICP.

2. The device of claim 1, wherein said integrated circuit package comprises a flip chip.

3. The device of claim 1, wherein said heatspreader comprises a thermally conductive material and wherein a thickness of said heatspreader is in the range of approximately 0.3 to 1.5 mm.

4. The device of claim 3, wherein said heatspreader comprises a copper sheet clad in nickel.

5. The device of claim 4, wherein said nickel is plated with gold.

6. The device of claim 1, wherein a hardness of said base piece is greater than a hardness of said heatspreader.

7. The device of claim 1, wherein said base material comprises steel.

8. The device of claim 1, wherein said surface of said base piece into which said base cavity is formed is substantially planar.

9. The device of claim 1, wherein said surface of said top piece into which said top cavity is formed is substantially planar.

10. The device of claim 1, wherein a depth of said top cavity is in the range of approximately 2.0 to 8.0 mm.

11. The device of claim 1, wherein a hardness of said top piece is greater than a hardness of said heatspreader.

12. The device of claim 1, wherein said top material comprises steel.

13. The device of claim 1, wherein said top piece comprises a first top piece and affixed to a second top piece, wherein said first top piece comprises said body portion of said top piece and includes said elongated member, and further wherein said first top piece includes said surface of said top piece into which said top cavity is formed.

14. The device of claim 13, wherein said second top piece is removably affixed to said first top piece whereby said second top is replaceable.

15. A method of removing a heatspreader from an integrated circuit package (ICP) to which said heatspreader is affixed, said method comprising:

inserting said heatspreader into a base cavity formed in a base piece of a remover device, wherein said cavity is adapted to receive and engage said heatspreader, and wherein a depth of said first cavity is approximately equal to a thickness of said heatspreader whereby said package is substantially exterior to said first cavity when said heatspreader is positioned in said cavity;

engaging said ICP with a top cavity formed in a body portion of a top piece of said remover device, wherein said top piece includes an elongated member extending from said body portion and suitable for manipulating said body portion; and with said heatspreader engaged in said base cavity and said ICP engaged in said top cavity, utilizing said extended member of said top piece to apply force to said heatspreader by moving said top piece relative to said base piece, wherein said force is sufficient to remove said heatspreader from said ICP.

16. The method of claim 15, further comprising, after the step of engaging said heatspreader in said base cavity and prior to the step of moving said top piece, heating said heatspreader to a temperature in excess of approximately 125° C.

17. The method of claim 15, further comprising, after the step of engaging said heatspreader in said base cavity and prior to the step of moving said top piece, heating said heatspreader to a temperature in the range of approximately 125 to 160° C.

18. The method of claim 17, wherein said base piece is comprised of a thermally conductive base material and wherein the step of heating said heatspreader comprises heating said base piece to a temperature in the range of approximately 125 to 160° C. and, thereafter, inserting said heatspreader into said base cavity and maintaining said heatspreader within said base cavity for a duration sufficient to raise the temperature of said heatspreader to in the range of approximately 125 to 160° C.

19. The method of claim 15, further comprising affixing said base piece to a stable platform prior to inserting said heatspreader into said base piece.

20. A device for removing a heatspreader from a flip chip package, said device comprising:

a base piece comprised of steel, wherein said base piece includes a surface into which a base cavity is formed, wherein said base cavity is adapted to receive and engage said heatspreader, and wherein a depth of said base cavity is approximately equal to a thickness of said heatspreader whereby said flip chip to which said heatspreader is affixed is exterior to said base cavity when said heatspreader is engaged in said base cavity;

a top piece comprised of tool steel, wherein a body portion of said top piece includes a surface into which a top cavity is formed, wherein said top cavity is adapted to receive and engage said ICP of said flip chip, said top piece further including an elongated member extending away from said body portion, wherein said elongated member is suitable for manipulating said body portion to apply a torquing force to said ICP when said ICP is engaged in said top cavity; and wherein, said base cavity of said base piece and said top cavity of said top piece are adapted to form an enclosure suitable for retaining said ICP and said hcatspreader when said surface of said base piece is aligned and in contact with said surface of said top piece, with said heatspreader being engaged by said base cavity and said ICP being engaged by said top cavity such that said top piece is suitable for applying a torquing force to said heatspreader while said base piece retains said ICP.

\* \* \* \* \*